United States Patent [19]

Casey et al.

[11] Patent Number: 5,655,209
[45] Date of Patent: Aug. 5, 1997

[54] MULTILAYER CERAMIC SUBSTRATES HAVING INTERNAL CAPACITOR, AND PROCESS FOR PRODUCING SAME

[75] Inventors: Jon Alfred Casey, Poughkeepsie; John Paul Gauci, Wappingers Falls; Dinesh Gupta, Poughkeepsie; Robert Anthony Rita, Wappingers Falls; Robert J. Sullivan, Pleasant Valley, all of N.Y.

[73] Assignee: International Business Machines Corporation, Armonk, N.Y.

[21] Appl. No.: 412,405

[22] Filed: Mar. 28, 1995

[51] Int. Cl.⁶ .................... B22F 3/10; B22F 7/02
[52] U.S. Cl. .................... 419/10; 419/7; 419/36; 419/37; 266/56; 266/63; 29/17.1; 29/592.1; 29/DIG. 31
[58] Field of Search .................... 419/2, 7, 36, 37, 419/10; 266/200, 236, DIG. 36, 56, 63; 29/DIG. 47, 17.1, 31, 527.1, DIG. 5, DIG. 24

[56] References Cited

U.S. PATENT DOCUMENTS

| 2,389,420 | 11/1945 | Deyrup | 75/22 |
|---|---|---|---|
| 3,225,939 | 12/1965 | Rodriguez et al. | 29/25.42 |
| 3,768,144 | 10/1973 | Heinss | 29/432 |
| 3,852,877 | 12/1974 | Ahn et al. | 29/625 |
| 4,237,084 | 12/1980 | Payne et al. | 264/61 |
| 4,337,162 | 6/1982 | Payne et al. | 252/62.3 |
| 4,340,436 | 7/1982 | Dubetsky et al. | 156/89 |
| 4,504,339 | 3/1985 | Kamehara et al. | 156/89 |
| 4,540,621 | 9/1985 | Eggerding et al. | 428/209 |
| 4,642,148 | 2/1987 | Kurihara et al. | 156/89 |
| 4,661,181 | 4/1987 | Camps et al. | 156/89 |
| 4,799,983 | 1/1989 | Desai | 156/89 |
| 4,806,188 | 2/1989 | Rellick | 156/89 |
| 4,868,711 | 9/1989 | Hirama et al. | 361/321 |
| 4,903,166 | 2/1990 | Galuagni | 361/321 |
| 4,929,295 | 5/1990 | Kohno et al. | 156/230 |
| 4,956,744 | 9/1990 | Berghout et al. | 361/321 |
| 5,004,715 | 4/1991 | Hakotani et al. | 501/136 |
| 5,006,182 | 4/1991 | Gantzhorn, Jr. et al. | 156/89 |
| 5,019,200 | 5/1991 | Kawabata et al. | 156/245 |
| 5,046,236 | 9/1991 | Wada et al. | 29/610.1 |
| 5,072,329 | 12/1991 | Galvagni | 361/321 |
| 5,098,494 | 3/1992 | Reisman | 156/89 |
| 5,283,104 | 2/1994 | Aoude et al. | 428/195 |
| 5,304,274 | 4/1994 | Crownover et al. | 156/230 |
| 5,474,741 | 12/1995 | Mikeska et al. | 419/10 |

*Primary Examiner*—Charles T. Jordan
*Assistant Examiner*—Daniel Jenkins
*Attorney, Agent, or Firm*—Perman & Green

[57] ABSTRACT

Process for producing multilayer ceramic substrates using greensheet technology and thin dielectric ceramic greensheets for miniaturization purposes. The process avoids the screening of the thin greensheets by forming self-supporting fusible particulate metal electrode layers, interposing them with the thin greensheets and sintering the assembly to form the multilayer substrates such as integrated capacitors.

11 Claims, 1 Drawing Sheet

MULTILAYER CERAMIC SUBSTRATES HAVING INTERNAL CAPACITOR, AND PROCESS FOR PRODUCING SAME

BACKGROUND OF THE INVENTION

1. Field of the Invention

The present invention relates to the production of multilayer ceramic laminates such as capacitors for electronic application, and more particularly to the production of laminates from a plurality of dielectric ceramic greensheets and interposed conductive electrode layers to form multilayer ceramic laminate units.

The increasing demands for miniaturization and greater electrical capacity of electronic components has created production and performance problems. For example, miniaturization requires the use of thinner insulating ceramic greensheet layers between the conductive layers.

Thin greensheet layers, less than about 3 mils in thickness, are difficult to process into multi-layer ceramic laminates in the conventional production process because the thin greensheets distort greatly and lose mechanical strength during screening with flowable conductive ink or paste composition, and weakened, distorted or warped greensheets are difficult to laminate into reliable multilayer ceramic substrates.

2. Background Art

It is well known to produce multilayer ceramic laminates containing internal capacitors using conventional greensheet technology, and reference is made to U.S. Pat. Nos. 4,868,711; 4,956,744; 5,019,200; 5,046,236; 5,072,329 and 5,304,274 for their disclosures of such laminates and processes for producing them.

In general, the prior known processes include the step of screening flowable conductive metal ink or paste compositions, which may include a ceramic additive, onto dielectric greensheets to form the electrode layers. Therefore such processes encounter the aforementioned distortion and warpage problems if the dielectric greensheets used are less than about 3 mils in thickness.

U.S. Pat. No. 5,072,329 discloses the production of multilayer ceramic capacitive devices in which ceramic metal intervening inks are printed below and above the conductive electrode ink layer printed on a supporting ceramic greensheet layer to form multilayer capacitors in which each printed conductive electrode layer is sandwiched between two printed intervening layers having good bonding properties for both the printed electrode layer on one side thereof and the cast dielectric ceramic layer on the other side thereof. The purpose or function of the printed intervening layer is to provide affinity for both the ceramic greensheet layers and the printed conductive metal layers to resist delamination.

SUMMARY OF THE INVENTION

The present invention provides a novel method for producing multilayer ceramic capacitor laminates from a plurality of cast dielectric ceramic greensheet layers which include one or more thin greensheet layers having a thickness less than about 3 mils, with interposed cast conductive electrode layers, while avoiding the loss of mechanical strength and the distortion generally encountered when fluid conductive ink or paste compositions used for forming the electrode layers are applied to such thin greensheet layers. The present invention avoids the aforementioned problems and disadvantages by pre-forming the conductive electrode layers as self-supporting thin fusible layers of composition preferably comprising a ceramic or insulating phase, a resinous binder material and a particulate conductive phase, such as molybdenum, to render the electrode layer electrically conductive. Most preferably, a ceramic material comprising the same ceramic material used in the dielectric ceramic greensheets is used to form the electrode layer so that the dielectric insulating layers and the electrode layers fuse together during sintering and firing of the final laminate.

THE DRAWINGS

FIG. 1 is a diagrammatic cross-sectional view of a plurality of dielectric ceramic greensheets and a plurality of interposed self-supporting electrode layers, separated for purposes of illustration, ready for lamination and firing, and FIG. 2 is a diagrammatic cross-sectional view of a multilayer ceramic capacitor produced by laminating and firing the layers of FIG. 1, and thereafter attaching end termination contacts in conventional manner; and FIG. 3 is a diagrammatic cross-sectional view of a multilayer ceramic capacitor produced by laminating alternate dielectric layers and electrode layers, and thereafter forming areas and filling the vias with conductive paste.

DETAILED DESCRIPTION

Figure 1:
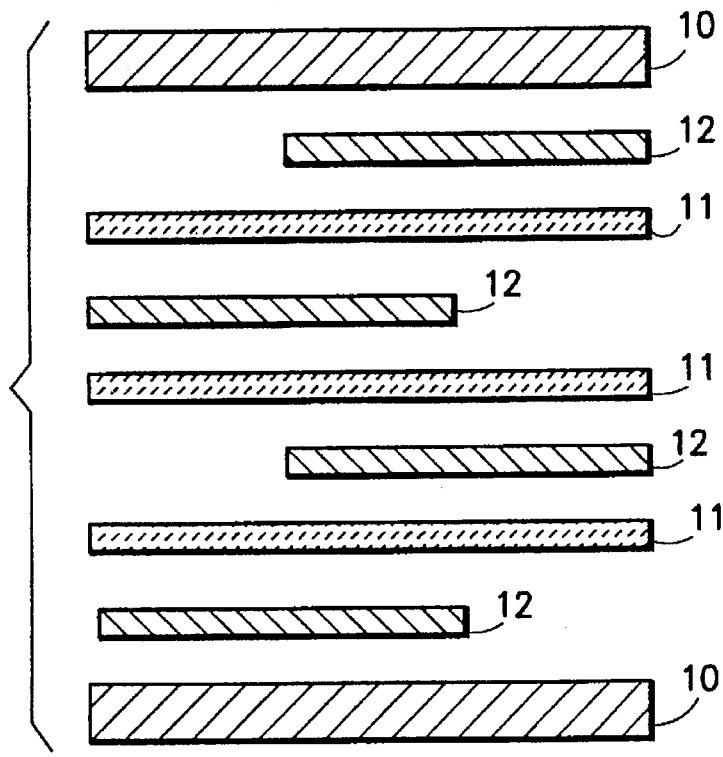

Referring to the particular assembly of layers illustrated by FIG. 1, a plurality of dielectric, insulative ceramic greensheets are cast in conventional manner from conventional ceramic compositions such as cordierite glass, alumina, etc. and binder material. Some of the greensheets, such as the outer greensheets 10, are cast to a conventional thickness of about 5 to 8 mils, while the other inner greensheets 11 are cast as thin layers having a thickness preferably less than about 3 mils, such as about 2 mils.

Also, a plurality of conductive ceramic-metal electrode layers 12 are cast in conventional greensheet manner from compositions containing a ceramic, such as cordierite glass, alumina, etc., a conductive metal, such as molybdenum, tungsten and copper, and an organic or inorganic binder material. The electrode layers 12 preferably have a thickness similar to layers 11, i.e., less than about 3 mils, preferably about 2 mils.

Figure 2:
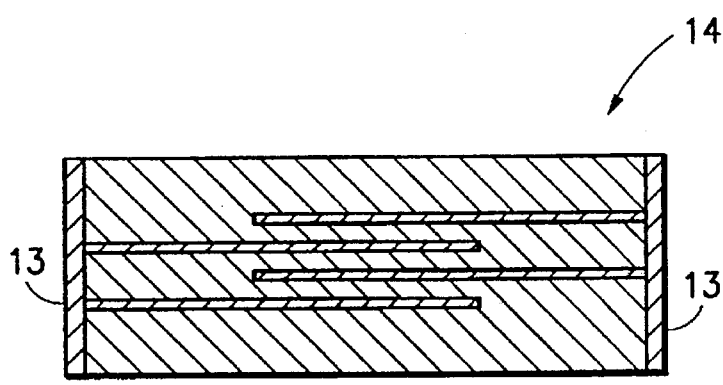

The self-supporting solid layers 10, 11 and 12 are assembled and laminated in the configuration illustrated by FIG. 1. The assembled sheets 10, 11 and 12 of FIG. 1 are laminated by heating while pressure is applied thereto. Generally, the step of heating is within the range of about 60°–90° C., which is a temperature just sufficient to soften the organic binder composition. Generally, the step of pressing is between about 500 to 5000 pounds per square inch (psi) which is just sufficient to press the conductive electrode layers 12 into the softened dielectric green sheets 10 and 11. The pressure will normally be applied for about 30 to 120 seconds. The temperatures, pressure and times will vary somewhat depending on the constitution of the binder composition. Thus, the temperatures, pressures and times specified above are to be considered as guides for the proper application of the invention and may be adjusted as appropriate. The laminate is fired to produce a multilayer substrate to which end termination contacts 13 are applied, such as by application of a conductive metal-glass frit and heating to a sintering temperature to form the final capacitor 14. As illustrated by FIG. 2, the capacitor 14 has the encapsulated thin electrode layers 12 closely-spaced from each other by thin layers of insulative dielectric ceramic composition resulting from the sintering of the thin greensheet layers 11. Additionally, vias can be used instead of, or in addition to, the edge electrodes. The vias will allow for I/O pads or as pins to be used for termination.

The use of pre-formed thin electrode layers 12 avoids the necessity of patterning or screening the thin greensheet layers 11. Therefore the thin layers 11 are not distorted, warped or weakened since they are not contacted with conductive ink or paste. Depending upon the application, it may be desirable to have the electrode layers be made entirely of conductive metal particles, although care must be exercised during processing in order to avoid distortion and delamination of the ceramic laminate. The electrode layers 12 preferably are cast from fusible ceramic-metal particle composition which preferably comprises from about 16% to about 80% by volume, most preferably about 50% by volume of conductive metal particles such as molybdenum, tungsten or copper, and from about 84% to about 20% by volume, most preferably about 50% by volume of dielectric ceramic such as cordierite glass, optionally containing up to 10% by volume of lower melting point non-cordierite glass. However, the metal content of the electrode layers may be varied between a lower limit of about 16% by volume up to a maximum limit of about 100% by volume, as discussed above. In addition a small amount of an organic binder material and vehicle is included for the formation of the greensheet layers and electrode layers, which materials are completely burned off during the firing step.

Figure 3:
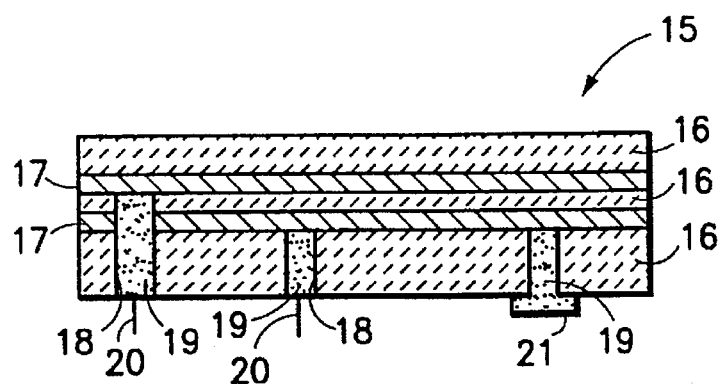

According to the embodiment of FIG. 3, a laminate 15 is produced in which the electrode terminations are provided at a surface of the laminate rather than at the edges thereof. Dielectric layers 16 and alternate electrode layers 17 are laminated to form a multi-layer assembly. Vias 18 are bored through an outer dielectric layer down to the desired electrode layer 17 and are filled with conductive past 19 to provide surface terminations such as pins 20 and an I/O pad 21 at a surface of an outer dielectric layer 16.

It will be apparent that the electrode layers 17 of FIG. 3 need not extend to the edges of the laminate 15 since edge electrodes are not employed thereon.

Various ceramic materials are useful with the process according to the invention. Among these ceramic materials, to name a few, are alumina, mullite, glass ceramics and aluminum nitride. However, a preferred material is alumina, $Al_2O_3$. Also preferred for use in the invention are the glass ceramic materials which are disclosed in Kumar et al. U.S. Pat. Nos. 4,301,324 and 4,413,061 which are incorporated by reference herein. Of the glass ceramics disclosed in the Kumar et al. patents the preferred glass ceramics are those of the spodumene and cordierite type glass ceramics. A common feature of these sintered glass ceramics among others is their excellent sinterability and crystallization below about 1000° C., and their low dielectric constants. The sintering temperature for the alumina ceramics is in excess of about 1400° C. The sintering temperature of the substrate must be adjusted according to the ceramic material used in the substrate, as is well known to those skilled in the art.

It will be apparent to those skilled in the art that the present process is applicable to multi-layer ceramic laminates of dielectric ceramic greensheets and ceramic-metal electrode sheets based upon any of the variety of ceramic compositions commonly used to produce multilayer ceramic substrates.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. Process for the production of multilayer ceramic substrates from ceramic greensheet layers comprising the steps of:

(a) forming a plurality of dielectric ceramic greensheet layers;

(b) forming a plurality of self-supporting conductive electrode layers comprising fusible metal particles and a binder material;

(c) assemblying said dielectric and electrode layers with an electrode layer being positioned between each adjacent pair of dielectric layers, and (d) firing said assembly to sinter said layers and form a multilayer ceramic substrate.

2. Process according to claim 1 in which said ceramic substrate is a capacitor in which alternate pairs of electrode layers are connected to different terminals.

3. Process according to claim 1 in which said greensheet layers include thin greensheet layers having a thickness less than about 3 mils.

4. Process according to claim 3 in which said greensheet layers include thin greensheet layers having a thickness of about 2 mils.

5. Process according to claim 1 in which said electrode layers comprise from about 0% to 84% by volume of a particulate ceramic material and from 100% to 16% by volume of conductive metal particles.

6. Process according to claim 5 in which said electrode layers comprise a mixture of a particulate alumina and conductive metal particles from the group consisting of molybdenum, tungsten and copper.

7. Process according to claim 5 in which said metal particles comprise molybdenum.

8. Process according to claim 1 in which said electrode layers comprise from about 16% to 80% by volume of the metal particles and from about 84% to 20% by volume of the ceramic material particles.

9. Process according to claim 8 in which said electrode layers comprise about 50% by volume of metal particles and 50% by volume of ceramic material particles.

10. Process according to claim 1 in which said electrode layers have a thickness less than about 3 mils.

11. Process according to claim 1 in which said electrode layers have a thickness of about 2 mils.

* * * * *